US008716662B1

(12) United States Patent
MacDonald et al.

(10) Patent No.: US 8,716,662 B1
(45) Date of Patent: May 6, 2014

(54) METHODS AND APPARATUS TO REVIEW DEFECTS USING SCANNING ELECTRON MICROSCOPE WITH MULTIPLE ELECTRON BEAM CONFIGURATIONS

(75) Inventors: Paul MacDonald, Tracy, CA (US); Hong Xiao, Pleasanton, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 13/549,847

(22) Filed: Jul. 16, 2012

(51) Int. Cl.
*H01J 37/28* (2006.01)

(52) U.S. Cl.
USPC .......................... 250/311; 250/307; 250/310

(58) Field of Classification Search
USPC .................................................. 250/306–311
See application file for complete search history.

(56) References Cited

U.S. PATENT DOCUMENTS

| | | | |
|---|---|---|---|
| 6,570,154 B1 | 5/2003 | Masnaghetti et al. | |
| 6,590,409 B1* | 7/2003 | Hsiung et al. | 324/754.22 |
| 6,803,571 B1* | 10/2004 | Mankos et al. | 850/9 |
| 7,105,815 B2* | 9/2006 | Obara et al. | 250/310 |
| 7,586,097 B2 | 9/2009 | Gorrell et al. | |
| 8,045,145 B1 | 10/2011 | Bakker et al. | |
| 2005/0200841 A1* | 9/2005 | Talbot et al. | 356/237.4 |
| 2006/0243908 A1* | 11/2006 | Shinada et al. | 250/310 |
| 2007/0023658 A1* | 2/2007 | Nozoe et al. | 250/310 |
| 2009/0101816 A1* | 4/2009 | Noji et al. | 250/310 |
| 2009/0134327 A1* | 5/2009 | Ikku et al. | 250/307 |
| 2011/0155905 A1 | 6/2011 | Hatakeyama et al. | |
| 2011/0204263 A1* | 8/2011 | Phaneuf et al. | 250/492.2 |

OTHER PUBLICATIONS

Ryo Nakagaki, et al. "Automatic recognition of defect areas on a semiconductor wafer using multiple scanning electron microscope images", Jun. 10, 2009, 3 pages [retrieved on Jan. 18, 2013], retrieved from the internet: http://iopscience.iop.org/0957-0233/20/7/075503.

* cited by examiner

*Primary Examiner* — Nicole Ippolito
*Assistant Examiner* — David E Smith
(74) *Attorney, Agent, or Firm* — Okamoto & Benedicto LLP

(57) ABSTRACT

One embodiment relates to a method of reviewing defects using a scanning electron microscope (SEM). A defect location having a defect for review is selected, and the SEM is configured to be in a first imaging configuration. The selected defect location is imaged using the SEM to generate a first SEM image of the selected defect location. A determination is made as to whether the defect is visible or non-visible in the first SEM image. If the defect is non-visible in the first SEM image, then the SEM is configured to be into a second imaging configuration, the selected defect location is imaged using the SEM to generate a second SEM image of the selected defect location, and a further determination is made as to whether the defect is visible or non-visible in the second SEM image. Other embodiments, aspects and features are also disclosed.

8 Claims, 4 Drawing Sheets

METHODS AND APPARATUS TO REVIEW DEFECTS USING SCANNING ELECTRON MICROSCOPE WITH MULTIPLE ELECTRON BEAM CONFIGURATIONS

BACKGROUND OF THE INVENTION

1. Field of the Invention

The present invention relates to methods and apparatus for inspection and review of semiconductor wafers and other manufactured substrates.

2. Description of the Background Art

An automated defect review system generally receives a defect location that is determined previously by an automated inspection system. The inspection system may determine the defect location using bright or dark field optical imaging or by electron beam imaging.

The defect review system may then use a scanning electron microscope (SEM) having a pre-set electron beam configuration, usually in a secondary electron mode, to obtain an image at the defect location. However, there are almost always some defects that are detected by the inspection system but do not show up (i.e. are not visible to) the review system. These defects are conventionally classified as SEM non-visible (SNV) defects.

SUMMARY

One embodiment relates to a method of reviewing defects in an automated manner using a scanning electron microscope (SEM). A defect location having a defect for review is selected, and the SEM is configured to be in a first imaging configuration. The selected defect location is imaged using the SEM to generate a first SEM image of the selected defect location. A determination is made as to whether the defect is visible or non-visible in the first SEM image. If the defect is non-visible in the first SEM image, then the SEM is configured to be into a second imaging configuration, the selected defect location is imaged using the SEM to generate a second SEM image of the selected defect location, and a further determination is made as to whether the defect is visible or non-visible in the second SEM image.

Another embodiment relates to an apparatus for reviewing defects in an automated manner using a SEM. The apparatus includes an electron beam column configured to generate an incident electron beam and scan the incident beam over a surface of a target substrate, a detector configured to detect secondary electrons, and a system controller and data processing system. The system controller and data processing system is configured to perform steps of: selecting a defect location having a defect for review; configuring the SEM to be in a first imaging configuration; imaging the selected defect location using the SEM to generate a first SEM image of the selected defect location; and determining whether the defect is visible or non-visible in the first SEM image. The system controller and data processing system is further configured such that, if the defect is non-visible in the first SEM image, then the SEM is configured to be into a second imaging configuration, the selected defect location is imaged using the SEM to generate a second SEM image of the selected defect location, and a further determination is made as to whether the defect is visible or non-visible in the second SEM image.

Other embodiments, aspects and features are also disclosed.

DETAILED DESCRIPTION

Figure 1:
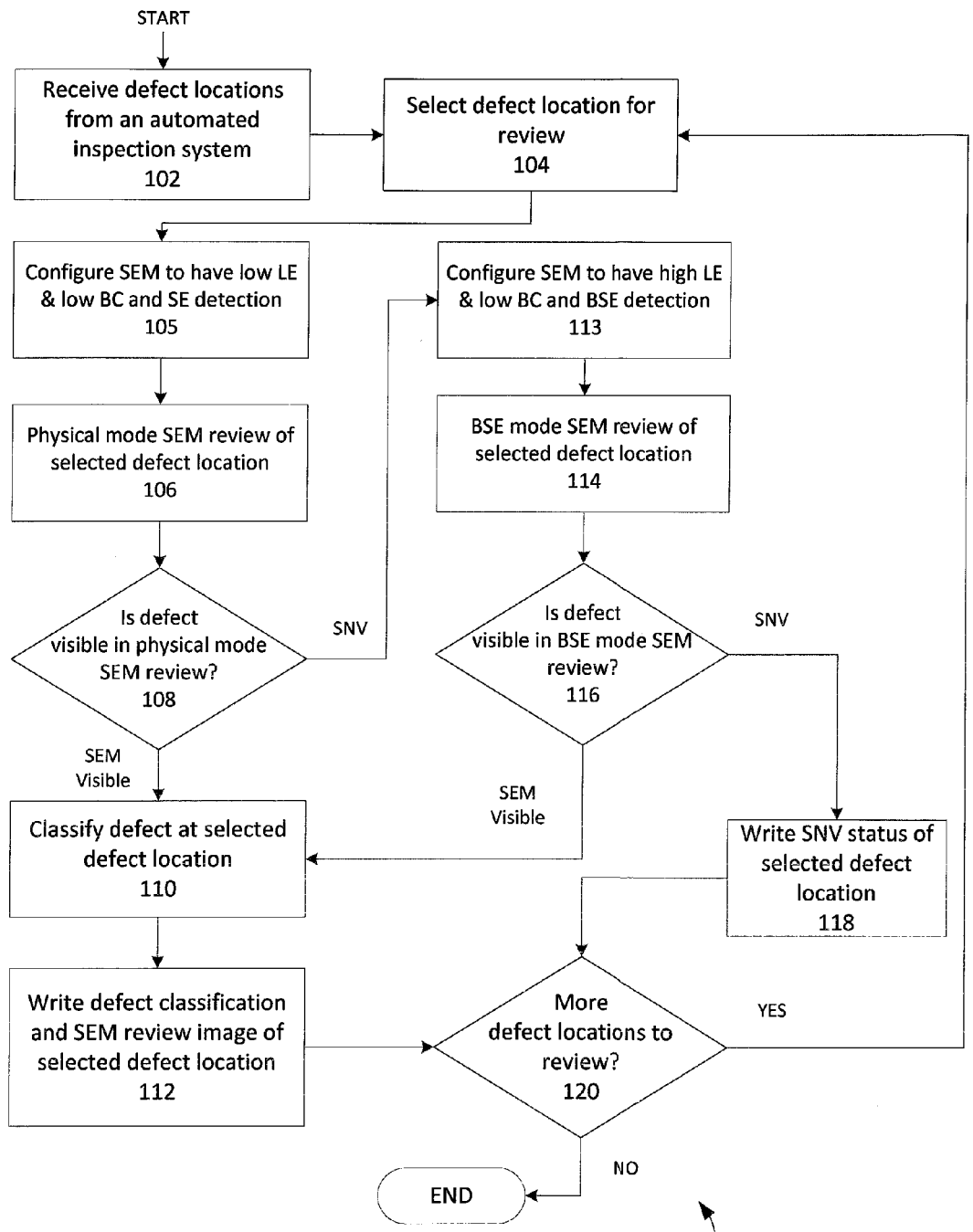
FIG. 1 is a flow chart of a method of automated defect review using an automated review apparatus with SEM imaging in accordance with an embodiment of the invention.

FIG. 1 is a flow chart of a method 100 of automated defect review using an automated review system with SEM imaging in accordance with an embodiment of the invention. In one embodiment, the automated review apparatus may be an apparatus 200 such as that depicted in FIG. 2.

Per step 102, the apparatus may receive defect locations from an automated inspection apparatus. The inspection apparatus may determine the defect locations using bright or dark field optical imaging or by electron beam imaging. Multiple defect locations may be received for review.

Per step 104, the apparatus may select a defect location for review from the multiple defect locations. In addition, the SEM may be configured to have a low landing energy (LE) and low beam current (BC) and to detect secondary electrons (SE) per step 105. This configuration may be referred to as a physical mode. The low landing energy beam may be suitable to obtain image data from a layer at or near the surface of the target substrate so as to image defects at or near the substrate surface. In one embodiment, the low landing energy may be in the range between 0.4 kilo-electron-volts (keV) and 1 keV, and the beam current may be in the range between 50 pico-amperes (pA) and 100 pA.

Per step 106, the selected defect location is then reviewed by imaging an area including the defect location using the SEM in the physical mode configuration. For example, using the apparatus 200 of FIG. 2, the incident electron beam 203 may be scanned over an area of the target substrate 222, where the scanned area includes the selected defect location. Secondary electrons may then be detected by the detector 228 such that high-resolution image data of the scanned area may be generated and stored.

Per step 108, a determination may then be made as to whether or not the defect is visible in the image data obtained by the SEM in the physical mode configuration. This may be performed by automated processing of the image data to detect the defect.

If the defect is determined to be visible in the physical mode SEM image (SEM Visible or SV), then the method 100 may move forward to step 110. In step 110, the defect at the selected defect location which is visible in the physical mode SEM image may be classified into a defect classification. Per step 112, the defect classification and the physical mode SEM review image at the selected defect location may then be written (stored) into a record. Thereafter, per step 120, a determination may be made as to whether or not there are more defect locations to review. If there are more defect locations to review, then the method 100 loops back to step 104 and selects a next defect location for review. Otherwise, if there are no more defect locations to review, then the method 100 may end.

On the other hand, if the defect is determined to be non-visible in the SEM image (SEM Non-Visible or SNV), then the method 100 may go from step 108 to step 113. In step 113, SEM may be re-configured to have a high LE and a high BC and to detect backscattered electrons (BSE). This SEM configuration may be referred to as BSE mode. The high landing energy beam may be suitable to obtain image data from a layer below the surface of the target substrate so as to image defects that may be buried beneath the substrate surface. The detection of backscattered electrons may be accomplished by filtering out secondary electrons. This may be implemented by applying a voltage to an energy filter in the path of the scattered electrons which may be passed by the higher-energy backscattered electrons but not the lower-energy secondary electrons. In one embodiment, the high landing energy may be 5 keV or more. The beam current may be high, such as, for example, above one nA.

Per step 114, the selected defect location is then reviewed by imaging an area including the defect location using backscattered electrons detected by the SEM in the BSE mode. For example, using the apparatus 200 of FIG. 2, the incident electron beam 203 may be scanned over an area of the target substrate 222, where the scanned area includes the selected defect location. Backscattered electrons may then be detected by the energy-filtering of electrons traveling to the detector 228 such that high-resolution image data of the scanned area may be generated and stored.

Per step 116, a determination may then be made as to whether or not the defect is visible in the BSE image data obtained by the SEM in the BSE mode. This may be performed by automated processing of the BSE image data to detect the defect.

If the defect is determined to be visible in the BSE image (SEM Visible or SV) in step 116, then the method 100 may go to step 110. In step 110, the defect at the selected defect location which is visible in the BSE image may be classified into a defect classification. Per step 112, the defect classification and the BSE image at the selected defect location may then be written (stored) into a record associated with the selected defect location.

On the other hand, if the defect is determined to be non-visible in the SEM image (SEM Non-Visible or SNV) in step 116, then the method 100 may go to step 118. In step 118, the SEM Non-Visible or SNV status may be written (stored) into a record associated with the selected defect location.

Thereafter, per step 120, a determination may be made as to whether or not there are more defect locations to review. If there are more defect locations to review, then the method 100 loops back to step 104 and selects a next defect location for review. Otherwise, if there are no more defect locations to review, then the method 100 may end.

Figure 2:
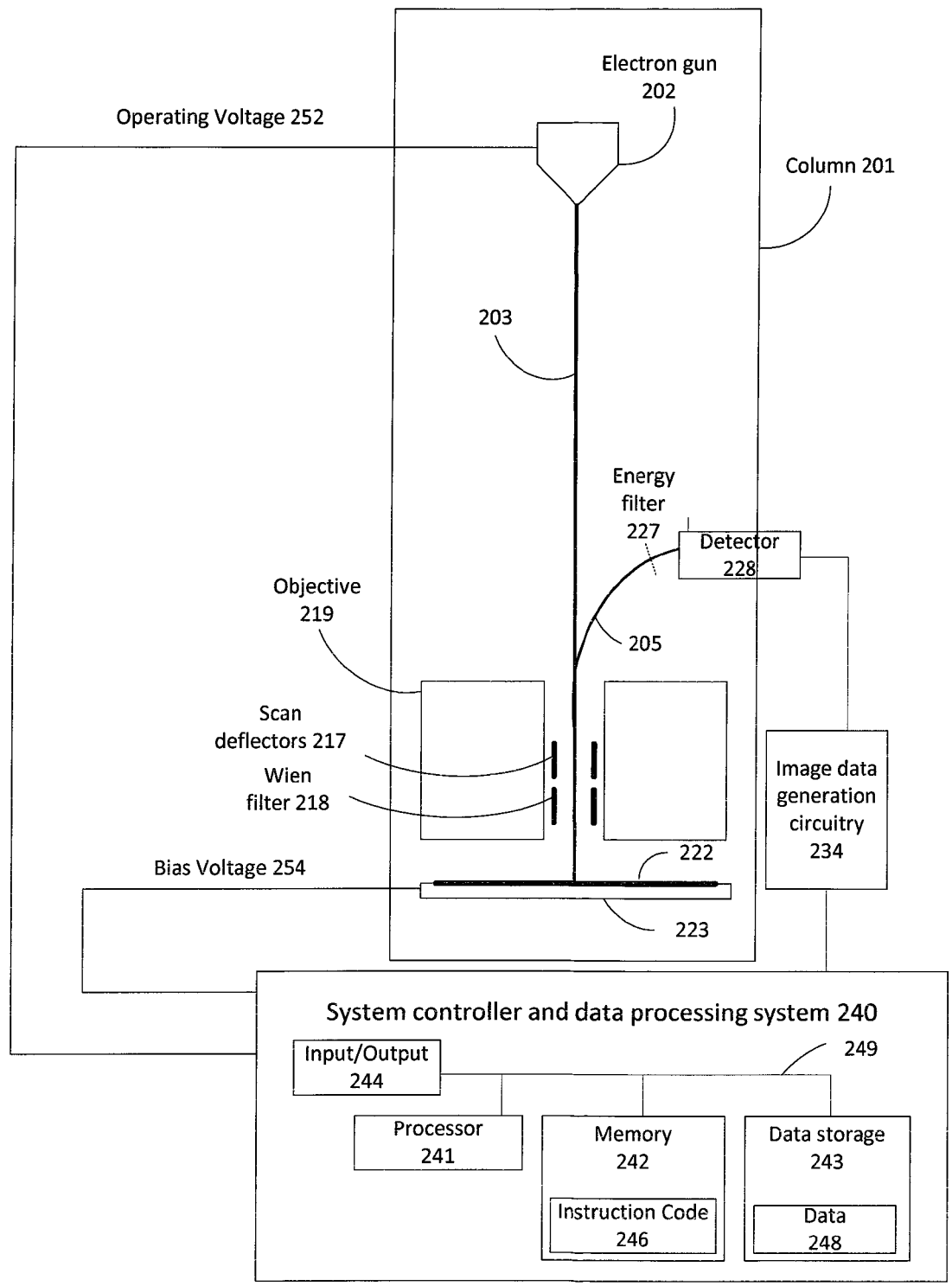
FIG. 2 is a block diagram depicting a cross-sectional view of an automated review apparatus which may be configured for defect review in accordance with an embodiment of the invention.

FIG. 2 is a diagram depicting a cross-sectional view of an example apparatus 200 which uses a scanning electron microscope for the automated review of defects in accordance with an embodiment of the invention. Note that FIG. 2 depicts select components and features of an example implementation of such an apparatus. The apparatus 200 may also include various other components and features which are not shown.

As shown in FIG. 2, the apparatus 200 may include an electron beam column 201 which has an electron gun 202. An incident electron beam 203 is generated by the electron gun 202. The incident beam 203 may be focused by one or more electron lenses in the column 201 (including objective lens 219) onto a beam spot on a surface of the target substrate 222.

The beam spot of the incident beam 203 may be raster scanned over an area of the surface using electrostatic scan deflectors 217. The target substrate 222 may be held by a movable stage 223.

The landing energy of the incident electrons is generally determined by the operating voltage 252 applied to the emitter of the electron gun 202 and the bias voltage 254 applied to the stage 223 which holds the target substrate 222. The bias voltage 254 is also typically applied to the objective lens 219. These applied voltages may be generated by high-voltage power supplies under control of the system controller and data processing system 240. In accordance with an embodiment of the invention, the operating voltage 252 and the bias voltage 254 may be controlled such that the landing energy may be at a high setting or at a low setting.

The apparatus 200 also includes a detection system which may be arranged to selectively detect electrons 205 in a controllable range of energies from the electrons emitted from the target substrate 222. In general, the electrons scattered (emitted) from the target substrate 222 may include secondary electrons and/or backscattered electrons. An energy filter 227 may be arranged in a path of the scattered electrons. A voltage may be applied to the energy filter 227 such that the backscattered electrons have sufficient energy to pass the filter while the secondary electrons do not have sufficient energy to pass the filter.

Once the electrons are detected by the detector 228, the detected signal may be received and processed by image data generation circuitry 234 (which may include, for example, analog-to-digital conversion circuitry and frame buffers). The image data generation circuitry 234 coordinates the detected signal with the beam scan signal so that image data of the surface may be generated. The image data generated by the image data generation circuitry 234 may be provided to the system controller and data processing system 240.

A simplified block diagram showing select components of the system controller and data processing system 240 is depicted in FIG. 2. As shown, the system controller and data processing system 240 may include a processor 240, memory 242, a data storage system 243, input/output interfaces 244, and a communication system 249 which communicatively interconnects the aforementioned components. The processor 240 may be configured to execute computer-readable instructions that may be stored in the memory 242. The data storage system 243 may be configured to stores instructions and data in a non-transitory manner on a computer-readable medium. The input/output interfaces 244 may be configured to communicate data with external components or systems.

As shown, in accordance with an embodiment of the invention, the memory 242 may be configured to hold instruction code 246 which may be executed by the processor 241. In accordance with an embodiment of the invention, the instruction code 246 may be configured so as to implement the method 100 described above in relation to FIG. 1, the method 300 described below in relation to FIG. 3, or the method 400 described below in relation to FIG. 4. As further shown, the data storage 243 may be configured to store data 248, including select image data from the image data generation circuitry 234.

Figure 3:
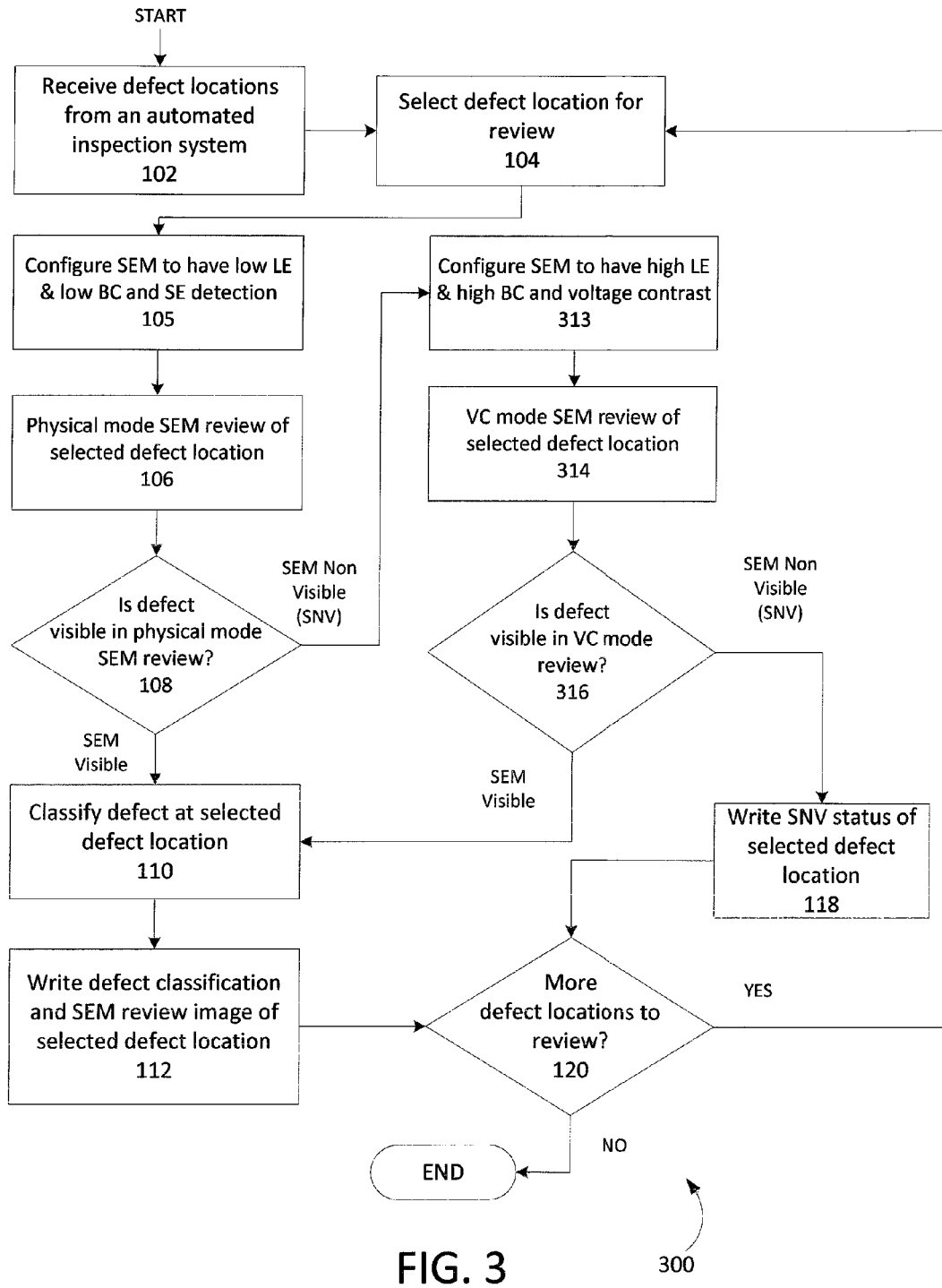
FIG. 3 is a flow chart of a method of defect review using an automated review apparatus with SEM imaging in accordance with another embodiment of the invention.

FIG. 3 is a flow chart of a method 300 of defect review using an automated review apparatus with SEM imaging in accordance with another embodiment of the invention. The differences between the method 300 of FIG. 3 differs and the method 100 of FIG. 1 are as follows.

If the defect is determined to be SEM non-visible (SNV) in step 108, then the method 300 of FIG. 3 configures the SEM to have a low landing energy and a high beam current and image with voltage contrast (VC) in step 313. To achieve the voltage contrast, one or more voltage signals are typically applied to select conductive lines on the manufactured substrate being reviewed. This SEM configuration may be referred to as VC mode. In one embodiment, the high beam current may be greater than one nano-ampere (nA). This high beam current and voltage contrast configuration is used during the SEM review of the selected defect location in step 314, and the high-beam-current voltage-contrast image obtained is used to determine whether or not the defect is visible in step 316.

If the defect is determined to be SEM visible in the voltage-contrast image, then the method 300 goes to step 110 (where the defect at the selected defect location is classified) and step 112 (where the defect classification and the voltage-contrast image of the selected defect location are recorded). On the other hand, if the defect is determined to be non-visible in the voltage-contrast image, then the method 300 moves on to step 118 (where SNV status of the selected defect location is recorded).

Figure 4:
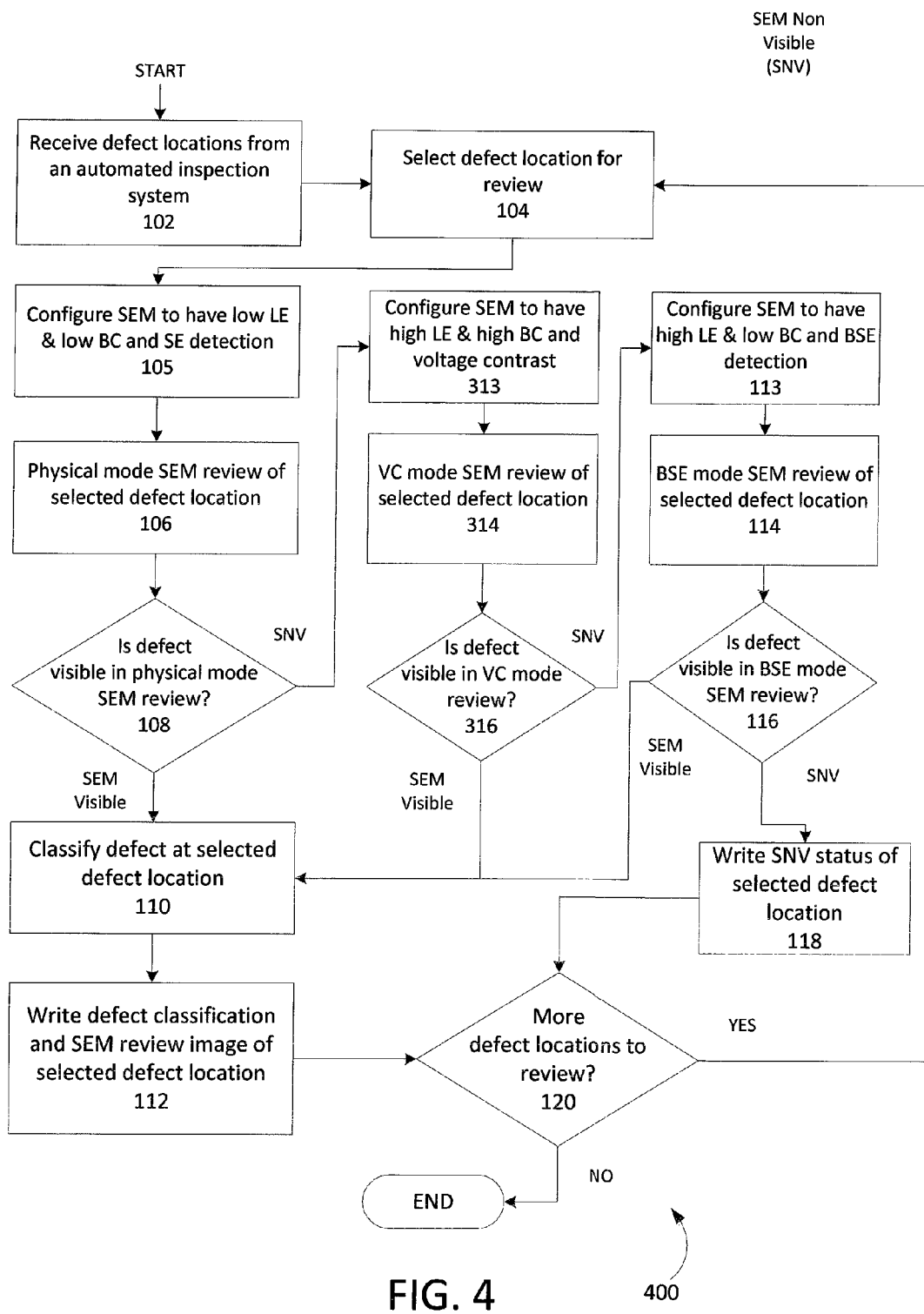
FIG. 4 is a flow chart of a method of defect review using an automated review apparatus with SEM imaging in accordance with another embodiment of the invention.

FIG. 4 is a flow chart of a method 400 of defect review using an automated review apparatus with SEM imaging in accordance with another embodiment of the invention. The differences between the method 400 of FIG. 4 differs and the method 300 of FIG. 3 are as follows.

If the defect is determined to be SEM non-visible (SNV) in step 316, then the method 400 of FIG. 4 moves on to step 113 (where the SEM is configured in the BSE mode). SEM review of the selected defect is then performed in the BSE imaging mode per step 114. Thereafter, per step 116, a determination may be made as to whether the defect is visible in the BSE image.

If the defect is determined to be SEM visible in the BSE image, then the method 400 goes to step 110 (where the defect at the selected defect location is classified) and step 112 (where the defect classification and the BSE image of the selected defect location are recorded). On the other hand, if the defect is determined to be non-visible in the BSE image, then the method 400 moves on to step 118 (where SNV status of the selected defect location is recorded).

Hence, the review flow of the method 400 of FIG. 4 is as follows. First, in the physical mode, the SEM is configured with low LE and low BC and to detect secondary electrons for a high-resolution surface defect review. Second, in a voltage-contrast mode, the SEM is configured with low LE and high BC and to image with voltage contrast at a lower resolution for a buried electrical (open or short circuit) defect review. Third, in a BSE mode, the SEM is configured with high LE and high BC and to detect backscattered electrons for a buried physical (material) defect review. The image resolution of BSE mode is typically between the high resolution of the physical mode and the lower resolution of the VC mode.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. A method of reviewing defects using a scanning electron microscope (SEM), the method comprising:
   selecting a defect location having a defect for review;
   configuring the SEM to be in a first imaging configuration;
   imaging the selected defect location using the SEM to generate a first SEM image of the selected defect location;
   determining whether the defect is visible or non-visible in the first SEM image;
   when the defect is non-visible in the first SEM image, then configuring the SEM to be into a second imaging configuration, imaging the selected defect location using the SEM to generate a second SEM image of the selected defect location, and determining whether the defect is visible or non-visible in the second SEM image; and
   when the defect is non-visible in the second SEM image, then configuring the SEM to be into a third imaging configuration, imaging the selected defect location using the SEM to generate a third SEM image of the selected defect location, and determining whether the defect is visible or non-visible in the third SEM image,
   wherein the first imaging configuration has a lower landing energy in a range between 0.4 keV and 1 keV, a lower beam current and detects secondary electrons, and the second imaging configuration has a higher beam current and images with voltage contrast, and the third imaging configuration has a higher landing energy above 5 keV and detects backscattered electrons.

2. The method of claim 1, wherein the lower beam current is below one hundred pico amperes, and the higher beam current is above one nano ampere.

3. The method of claim 2, further comprising:
   applying a voltage signal to a conductive line on a target substrate being reviewed so as to generate voltage contrast in the second SEM image.

4. The method of claim 1, further comprising:
   when the defect is visible in the first SEM image, then classifying the defect using the first SEM image and writing the first SEM image in a record associated with the selected defect location;
   when the defect is visible in the second SEM image, then classifying the defect using the second SEM image and writing the second SEM image in the record associated with the selected defect location;
   when the defect is visible in the third SEM image, then classifying the defect using the third SEM image and writing the third SEM image in the record associated with the selected defect location;
   writing a SEM non-visible status in the record associated with the selected defect location if the defect is non-visible in the first SEM image, the second SEM image, and the third SEM image.

5. The method of claim 1, further comprising:
   receiving defect locations from an inspection system; and
   after processing of the selected defect location is performed, determining if there are any more defect locations for review and looping back in the method and selecting a next defect location for review when there are more defect locations to review.

6. An apparatus configured to review defects using a scanning electron microscope, the apparatus comprising:
   an electron beam column configured to generate an incident electron beam and scan the incident beam over a surface of a target substrate;
   a detector configured to detect secondary electrons; and
   a system controller and data processing system configured to perform steps of selecting a defect location having a defect for review, configuring the SEM to be in a first imaging configuration, imaging the selected defect location using the SEM to generate a first SEM image of the selected defect location, determining whether the defect is visible or non-visible in the first SEM image, and when the defect is non-visible in the first SEM image, then configuring the SEM to be into a second imaging configuration, imaging the selected defect location using the SEM to generate a second SEM image of the selected defect location, and determining whether the defect is visible or non-visible in the second SEM image, and when the defect is non-visible in the second SEM image, then configuring the SEM to be into a third imaging configuration, imaging the selected defect location using the SEM to generate a third SEM image of the selected defect location, and determining whether the defect is visible or non-visible in the third SEM image,
   wherein the first imaging configuration has a lower landing energy, a lower beam current and detects secondary electrons, the second imaging configuration has a higher beam current and images with voltage contrast, and the third imaging configuration has a higher landing energy and detects backscattered electrons.

7. The apparatus of claim 6, the lower landing energy is in a range between 0.4 keV and 1 keV, and the higher landing energy is above 5 keV.

8. The apparatus of claim 6, wherein the system controller and data processing system is further configured to write a SEM non-visible status in the record associated with the selected defect location when the defect is non-visible in the first SEM image, the second SEM image, and the third SEM image.

* * * * *